United States Patent
Sauerland (12)

(10) Patent No.: US 11,942,449 B2
(45) Date of Patent: Mar. 26, 2024

(54) SEMICONDUCTOR ARRANGEMENT AND METHOD FOR PRODUCING THE SAME

(71) Applicant: Infineon Technologies AG, Neubiberg (DE)

(72) Inventor: Frank Sauerland, Werne (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/160,643

(22) Filed: Jan. 28, 2021

(65) Prior Publication Data

US 2021/0242163 A1     Aug. 5, 2021

(30) Foreign Application Priority Data

Feb. 3, 2020   (EP) .................................. 20155063

(51) Int. Cl.
*H01L 23/00*          (2006.01)

(52) U.S. Cl.
CPC .............. *H01L 24/49* (2013.01); *H01L 24/85* (2013.01); *H01L 2224/48091* (2013.01); *H01L 2224/49096* (2013.01); *H01L 2224/4918* (2013.01)

(58) Field of Classification Search
CPC . H01L 24/49; H01L 24/85; H01L 224/48091; H01L 224/49096; H01L 224/4918
See application file for complete search history.

(56) References Cited

U.S. PATENT DOCUMENTS

| 6,040,626 | A | * | 3/2000 | Cheah | H01L 23/49562 257/341 |
| 2004/0217488 | A1 | * | 11/2004 | Luechinger | B23K 20/008 257/784 |
| 2006/0017141 | A1 | | 1/2006 | Luo et al. | |

(Continued)

FOREIGN PATENT DOCUMENTS

| CN | 101499450 A | 8/2009 |
| CN | 109155301 A | 1/2019 |

OTHER PUBLICATIONS

"Bonding Wire", Product Guide 2015-A, TopLine Corporation, www.TanakaWire.com, February 2015—A, pp. 1-32.

(Continued)

*Primary Examiner* — Marc Anthony Armand
(74) *Attorney, Agent, or Firm* — Murphy, Bilak & Homiller, PLLC (57) ABSTRACT

A semiconductor arrangement includes a controllable semiconductor element having an active region, and bonding wires arranged in parallel to each other in a first horizontal direction. The active region has a first length in the first horizontal direction and a first width in a second horizontal direction perpendicular to the first horizontal direction. Each bonding wire is electrically and mechanically coupled to the controllable semiconductor element by a first number of bond connections arranged above the active region. A first bond connection of each bonding wire is arranged at a first distance from a first edge of the active region. A second bond connection of each bonding wire is arranged at a second distance from a second edge of the active region opposite the first edge. The first and second distances are both less than the first length divided by twice the first number of bond connections.

11 Claims, 3 Drawing Sheets

(56) References Cited

U.S. PATENT DOCUMENTS

| | | | |
|---|---|---|---|
| 2009/0189264 A1* | 7/2009 | Yato | H01L 23/49513 |
| | | | 257/676 |
| 2011/0241198 A1* | 10/2011 | Azuma | H01L 24/37 |
| | | | 257/696 |
| 2015/0221592 A1* | 8/2015 | Verma | H01L 23/5223 |
| | | | 257/773 |
| 2017/0125322 A1* | 5/2017 | Spann | H01L 23/3735 |
| 2019/0287964 A1* | 9/2019 | Yamano | H01L 27/06 |

OTHER PUBLICATIONS

Nordson, "Wedge-Wedge Ultrasonic Bonding", http://www.nordson.com/de-de/divisions/dage/products/materialien/CoorsTek/Documents/Coors Tek SmWedge.pdf, Oct. 9, 2013, pp. 1-60.

* cited by examiner

SEMICONDUCTOR ARRANGEMENT AND METHOD FOR PRODUCING THE SAME

TECHNICAL FIELD

The instant disclosure relates to a semiconductor arrangement and a method for producing the same.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrates. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted onto the semiconductor substrate employing soldering or sintering techniques. Further, a top side of the controllable semiconductor devices may be electrically contacted by means of bonding wires. A bonding wire may be electrically and mechanically coupled to a top side of a controllable semiconductor element with a second end, and may be electrically and mechanically coupled to the semiconductor substrate with a first end. While the semiconductor arrangement is being used, currents flow through the bonding wires, the metallization layers of the substrate, and the controllable semiconductor elements. Often the controllable semiconductor elements are switched on and off repeatedly. This results in a heating and subsequent cooling of the different components. Often the different components comprise different materials which have different coefficients of expansion. The components, therefore, may be exposed to stress or tensions which may negatively affect the stability of the connections, and therefore the performance and the overall lifetime of the semiconductor arrangement.

There is a need for a semiconductor arrangement in which the reliability of the connections between the bonding wires and a controllable semiconductor element is improved, thereby increasing the lifetime of the semiconductor arrangement.

SUMMARY

A semiconductor arrangement includes a controllable semiconductor element comprising an active region, and a plurality of bonding wires arranged in parallel to each other in a first horizontal direction. The active region has a first length in the first horizontal direction and a first width in a second horizontal direction perpendicular to the first horizontal direction. Each of the plurality of bonding wires is electrically and mechanically coupled to the controllable semiconductor element by means of a first number of bond connections, wherein each of the first number of bond connection is arranged above the active region in a vertical direction that is perpendicular to the first horizontal direction and the second horizontal direction. A first bond connection of each of the plurality of bonding wires is arranged at a first distance from a first edge of the active region in the first horizontal direction, wherein the first distance is less than the first length divided by twice the first number of bond connections, and wherein the first bond connection of each of the plurality of bonding wires is the bond connection arranged closest to the first edge, and a second bond connection of each of the plurality of bonding wires is arranged at a second distance from a second edge of the active region in the first horizontal direction, wherein the second edge is arranged opposite the first edge, and wherein the second distance is less than the first length divided by twice the first number of bond connections, and wherein the second bond connection of each of the plurality of bonding wires is the bond connection arranged closest to the second edge.

A method for producing a semiconductor arrangement includes mounting a plurality of bonding wires onto a controllable semiconductor element, the controllable semiconductor element comprising an active region. Mounting the plurality of bonding wires onto the controllable semiconductor element comprises, for each of the plurality of bonding wires, forming a first number of bond connections between the bonding wire and the controllable semiconductor element, thereby electrically and mechanically coupling the bonding wire to the controllable semiconductor element. The plurality of bonding wires is arranged in parallel to each other in a first horizontal direction. The active region has a first length in the first horizontal direction and a first width in a second horizontal direction perpendicular to the first horizontal direction. Each of the first number of bond connections is arranged above the active region in a vertical direction that is perpendicular to the first horizontal direction and the second horizontal direction. A first bond connection of each of the plurality of bonding wires is arranged at a first distance from a first edge of the active region in the first horizontal direction, wherein the first distance is less the first length divided by twice the first number of bond connections, and wherein the first bond connection of each of the plurality of bonding wires is the bond connection arranged closest to the first edge, and a second bond connection of each of the plurality of bonding wires is arranged at a second distance from a second edge of the active region in the first horizontal direction, wherein the second edge is arranged opposite the first edge, and wherein the second distance is less than the first length divided by twice the first number of bond connections, and wherein the second bond connection of each of the plurality of bonding wires is the bond connection arranged closest to the second edge.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". Electrical lines and electrical connections may include metal and/or semiconductor material, and may be permanently electrically conductive (i.e., non-switchable). A semiconductor body or controllable semiconductor element as described herein may be made of (doped) semiconductor material and may be a semiconductor chip or be included in a semiconductor chip. A semiconductor body or controllable semiconductor element has electrical connecting pads and includes electrodes.

Figure 1:
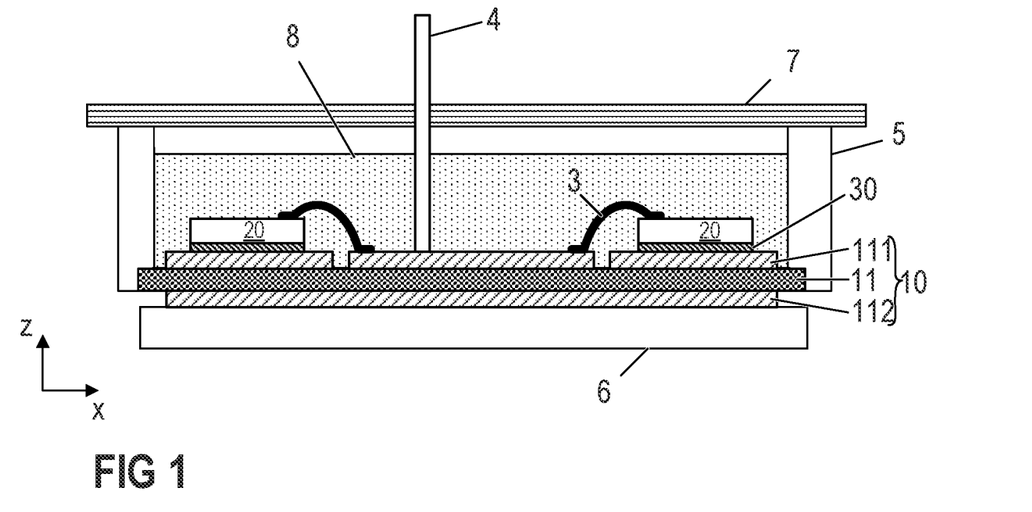
FIG. 1 is a cross-sectional view of a conventional power semiconductor module arrangement.

Referring to FIG. 1, a cross-sectional view of a power semiconductor module arrangement is schematically illustrated. The power semiconductor module arrangement includes a semiconductor substrate 10. The semiconductor substrate 10 includes a dielectric insulation layer 11, a first (structured) metallization layer 111 attached to the dielectric insulation layer 11, and a second (structured) metallization layer 112 attached to the dielectric insulation layer 11. The dielectric insulation layer 11 is disposed between the first and the second metallization layer 111, 112. It is, however, also possible that the semiconductor substrate 10 only comprises a first metallization layer 111, while the second metallization layer 112 is omitted.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 5. In the arrangement illustrated in FIG. 1, the semiconductor substrate 10 forms a ground surface of the housing 5, while the housing 5 itself solely comprises sidewalls. This is, however, only an example. It is also possible that the housing 5 further comprises a ground surface and/or a cover or lid and that the semiconductor substrate 10 is arranged inside the housing 5.

One or more controllable semiconductor elements (semiconductor bodies) 20 may be arranged on the semiconductor substrate 10. Each of the controllable semiconductor elements 20 arranged on the at least one semiconductor substrate 10 may include an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element. The one or more controllable semiconductor elements 20 may form a semiconductor arrangement on the semiconductor substrate 10. In FIG. 1, only two controllable semiconductor elements 20 are exemplarily illustrated.

The second metallization layer 112 of the semiconductor substrate 10 in FIG. 1 is a continuous layer. The first metallization layer 111 is a structured layer in the arrangement illustrated in FIG. 1. "Structured layer" means that the first metallization layer 111 is not a continuous layer, but includes recesses between different sections of the layer. Such recesses are schematically illustrated in FIG. 1. The first metallization layer 111 in this arrangement includes three different sections. Different controllable semiconductor elements 20 may be mounted on the same or to different sections of the first metallization layer 111. Different sections of the first metallization layer may have no electrical connection or may be electrically connected to one or more other sections using first electrical connections 3 such as, e.g., bonding wires or bonding ribbons. First electrical connections 3 may also include connection plates or conductor rails, to name just a few examples. The one or more controllable semiconductor elements 20 may be electrically and mechanically connected to the semiconductor substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example.

The power semiconductor module arrangement illustrated in FIG. 1 further includes terminal elements 4. The terminal elements 4 are electrically connected to the first metallization layer 111 and provide an electrical connection between the semiconductor substrate 10 and the outside of the housing 5. The terminal elements 4 may be electrically connected to the first metallization layer 111 with a first end, while a second end of the terminal elements 4 protrudes out of the housing 5. The terminal elements 4 may be electrically contacted from the outside at their second end.

For example, the second ends of the terminal elements 4 may be mechanically and electrically connected to an electronic board 7, e.g., a printed circuit board (PCB) having a dielectric insulation layer. Such an electronic board 7 may form a cover of the housing and may comprise through holes. The terminal elements 4 may be inserted into the through holes of the electronic board 7.

The housing 5 may be at least partly filled with a sealing resin 8. The sealing resin 8 may include a (filled) epoxy resin, silicone gel or other resin materials, for example. The sealing resin 8 is configured to seal the components of the power semiconductor module such as the semiconductor substrate 10, in particular the metal patterns formed by the first metallization layer 111, the controllable semiconductor elements 20, the first electrical connections 3, and the terminal elements 4, to provide for insulation and protection of the devices. For example, the sealing resin 8 may protect the components from certain environmental conditions and from mechanical damage. The sealing resin 8 may at least partly fill the interior of the housing 5, thereby covering the components and electrical connections that are arranged on the semiconductor substrate 10.

The power semiconductor module may further include a heat sink 6. The semiconductor substrate 10 may be connected to the heat sink 6 via a connection layer (not illustrated). Such a connection layer may be a solder layer, a layer of an adhesive, or a layer of a sintered metal powder, e.g., a sintered silver powder, for example.

FIG. 1 schematically illustrates a power semiconductor arrangement without a base plate. However, the semiconductor substrate 10 may also be mounted on a base plate. Such a base plate may be arranged on a heat sink 6 such that the base plate is arranged between the heat sink 6 and the semiconductor substrate 10, for example. In some power semiconductor module arrangements, more than one semiconductor substrate is arranged on a single base plate. The base plate, instead of the semiconductor substrate 10, may then form a ground surface of the housing 5, for example. Controllable semiconductor elements 20 may be arranged on one or more of a plurality of semiconductor substrates 10.

Figure 2:
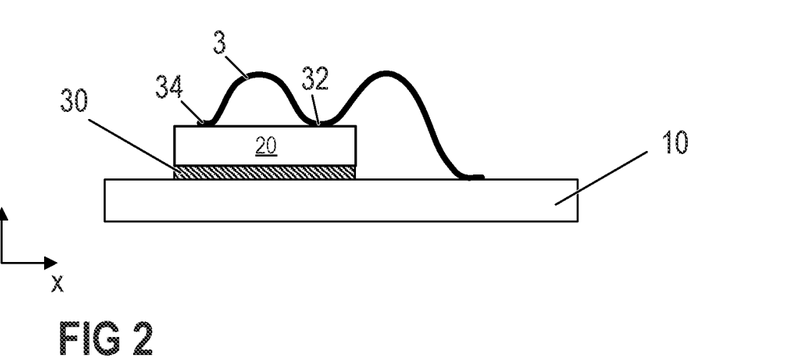
FIG. 2 is a cross-sectional view of a semiconductor arrangement.

Now referring to FIG. 2, a controllable semiconductor element 20 that is arranged on a semiconductor substrate 10 is illustrated in greater detail. The dielectric insulation layer 11 and the first and second metallization layers 111, 112 are not explicitly illustrated in FIG. 2. As has been described with respect to FIG. 1 above, the controllable semiconductor element 20 may be electrically and mechanically coupled to the semiconductor substrate 10 not only by means of an electrically conductive connection layer 30, but also by means of at least one first electrical connection 3 such as a bonding wire, for example. A first electrical connection 3 may be electrically and mechanically coupled to a top side of the controllable semiconductor element 20 with a second end, and to the semiconductor substrate 10 (e.g., first metallization layer 111) with a first end. A top side of the controllable semiconductor element 20 is a side of the controllable semiconductor element 20 which faces away from the semiconductor substrate 10. Usually, the first electrical connection 3 is bonded to the controllable semiconductor element 20. In many cases, not only one bond connection is formed between the first electrical connection 3 and the controllable semiconductor element 20. Often, two bond connections 32, 34 may be formed between the first electrical connection 3 and the controllable semiconductor element 20. The first electrical connection 3 (e.g., bonding wire) may extend in an arc or bow between the first bond connection 32 and the second bond connection 34 as is schematically illustrated in FIG. 2. Forming two bond connections 32, 34 between the first electrical connection 3 and the controllable semiconductor element 20 increases the reliability of the semiconductor arrangement by minimizing the self-heating of the bonding wires 3.

Figure 3:
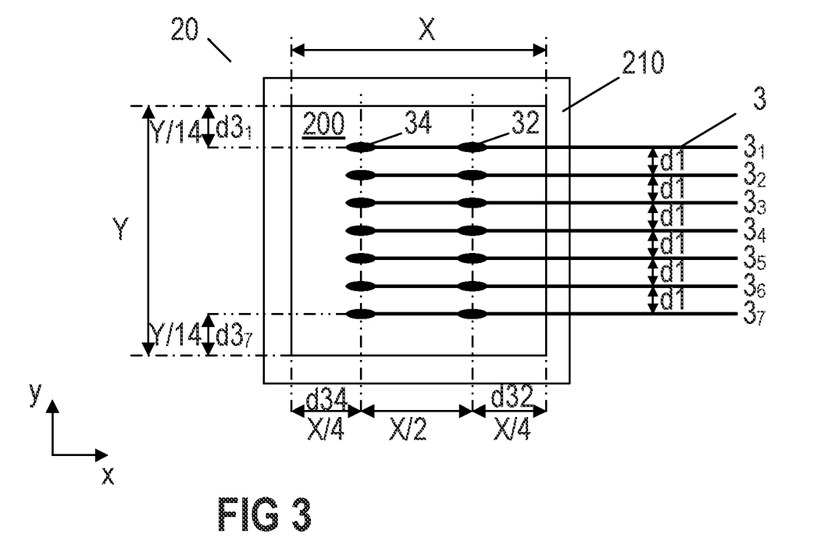
FIG. 3 is a top view of a semiconductor arrangement.

Even further, usually more than one first electrical connection 3 is used to electrically contact the controllable semiconductor element 20. Such a redundant design with a plurality of bonding wires $3_n$ is schematically illustrated in the top view of FIG. 3. FIG. 3 schematically illustrates a controllable semiconductor element 20. A plurality of first electrical connections (bonding wires) $3_n$ is mechanically and electrically coupled to the top side of the controllable semiconductor element 20. In FIG. 3, seven first electrical connections $3_1$-$3_7$ are illustrated. This, however, is only an example. Any suitable number n of first electrical connections $3_n$ may be used to contact the controllable semiconductor element 20 (e.g., n>1, or n>5). The number n of first electrical connections $3_n$ may depend on a size of the controllable semiconductor element 20, a maximum voltage through the first electrical connections $3_n$, and cost requirements, for example.

The bond connections 32, 34 between the bonding wires $3_n$ and the controllable semiconductor element 20 in the example of FIG. 3 are formed towards the center of the controllable semiconductor element 20. The controllable semiconductor element 20 comprises an active region 200. The active region 200 may be a region of the controllable semiconductor element 20 which carries a current when the controllable semiconductor element 20 is used. The active region 200 may be surrounded by a passive region 210, also referred to as edge region. Unlike the active region 200, the edge region 210 does not carry any currents while the controllable semiconductor element 20 is being used. The first bond connection 32 and the second bond connection 34 both are usually formed vertically (in a vertical direction z) above the active region 200. The vertical direction z is a direction which is perpendicular to the top surface of the controllable semiconductor element 20. The edge region 210 surrounds the active region 200 in a horizontal plane.

The plurality of bonding wires $3_n$ extend in a first horizontal direction x from the controllable semiconductor element 20 to the further bond connection (not specifically illustrated) formed on the semiconductor substrate 10 and are arranged parallel to each other. A distance d1 between two neighboring bonding wires $3_n$ may be equal for all of the bonding wires $3_n$. As has been mentioned above, the first bond connection 32 and the second bond connection 34 are often formed towards the center of the controllable semiconductor element 20, and in particular towards the center of the active region 200. The active region 200 may have a length X in the first horizontal direction x and a width Y in a second horizontal direction y which is perpendicular to the first horizontal direction x and to the vertical direction z. Concerning the distance d1, the following may apply: d1=Y/n, wherein n is the overall number of bonding wires 3. A distance d32 between a first edge of the active region 200 and the first bond connections 32 may be at least X/4 (d32≥X/4). This improves the electric distribution within the controllable semiconductor element 20. The same applies for a distance d34 between the second bond connections 34 and a second edge of the active region 200, the second edge being opposite to the first edge. Similarly, the outermost bonding wires ($3_1$ and $3_7$ in the example of FIG. 3) are arranged at distances $d3_1$ and $d3_7$, respectively, from the corresponding third and fourth edges of the active region 200. If d1=Y/n, then $d3_1$=$d3_7$=Y/(2*n).

Figure 4:
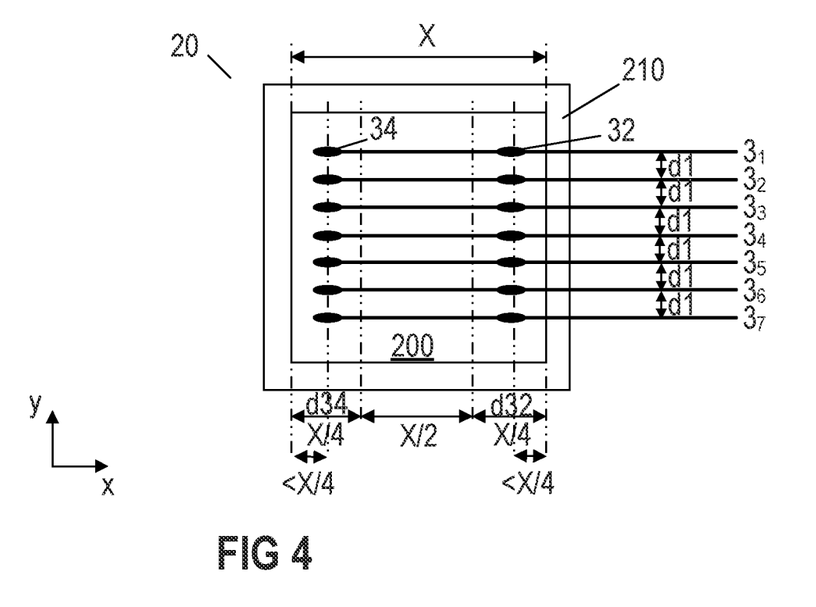
FIG. 4 is a top view of a semiconductor arrangement according to one example.

Now referring to FIG. 4, a semiconductor arrangement according to one example is schematically illustrated. In this example, contrary to what has been described with respect to FIG. 3 above, the first bond connection 32 and the second bond connection 34 are moved closer towards the respective edges of the active region 200. That is, the first bond connection 32 in this example is arranged at a distance d32<X/4 from the first edge of the active region 200. The second bond connection 34 is arranged at a distance d34<X/4 from the second edge of the active region 200, wherein the second edge is arranged opposite to the first edge. Moving the bond connections 32, 34 towards the edges of the active region 200, thereby increasing the distance between the first bond connections 32 and the second bond connections 34, worsens the electric distribution within the controllable semiconductor element 20 to a certain degree. However, the reliability of the bond connections 32, 34 is increased significantly. Therefore, even if the electric distribution is somewhat worsened, the lifetime of the bond connections 32, 34 and therefore of the overall semiconductor arrangement is increased.

In the exemplary semiconductor arrangement of FIG. 4, each bonding wire $3_n$ is mechanically and electrically coupled to the controllable semiconductor element 20 twice. That is, each bonding wire $3_n$ is mechanically and electrically coupled to the controllable semiconductor element 20 via a first bond connection 32 and a second bond connection 34. This, however, is only an example. It is also possible that for each of the plurality of bonding wires $3_n$ more than two bond connections are formed. For example, a third bond connection may be formed between the first bond connection 32 and the second bond connection 34. It is also possible that even further bond connections are formed between the first bond connection 32 and the second bond connection 34. Such further bond connections are not specifically illustrated in the Figures. However, most of the stress and tension occurs in the outermost bond connections, that is, in the first bond connection 32, which is the bond connection closest to the first edge of the active region 200, and in the second bond connection 34, which is the bond connection closest to the second edge of the active region. The distance d32 between the first bond connection 32 and the first edge, as well as the distance d34 between the second bond connection 34 and the second edge depends on the overall number of bond connections formed for each individual bonding wire $3_n$.

The distance d32 between the first bond connection 32 (bond connection that is closest to the first edge) and the first edge may be defined as d32<X/(2*m), wherein X is the length of the active region 200 in the first horizontal direction x, and m is the number of bond connections for each bonding wire $3_n$. That is, if each bonding wire $3_n$ is mechanically and electrically coupled to the controllable semiconductor element 20 by means of two bond connections 32, 34, as illustrated in FIG. 4, m=2 and the distance d32 results as d32<X/(2*2)=X/4. The same applies for the distance d34 between the second bond connection 34 (bond connection that is closes to the second edge) and the second edge which may be defined as d34<X/(2*m). If m=2, then d34<X/(2*m)=X/4.

If each bonding wire $3_n$ is mechanically or mechanically coupled to the controllable semiconductor element 20 more than twice, the distance between the outermost bond connections 32, 34 may be even less. For example, if m=3, then d32<X/(2*3)=X/6, and d34<X/(2*3)=X/6. The same applies for any other number of bond connections m, with m≥2. Any additional bond connections that are formed between the first bond connection 32 and the second bond connection 34 are generally less prone to stress and tension. Therefore, arranging such additional bond connections closer to the center of the active region is acceptable. Generally, additional bond connections may be arranged anywhere between the first bond connection 32 and the second bond connection 34.

Figure 5:
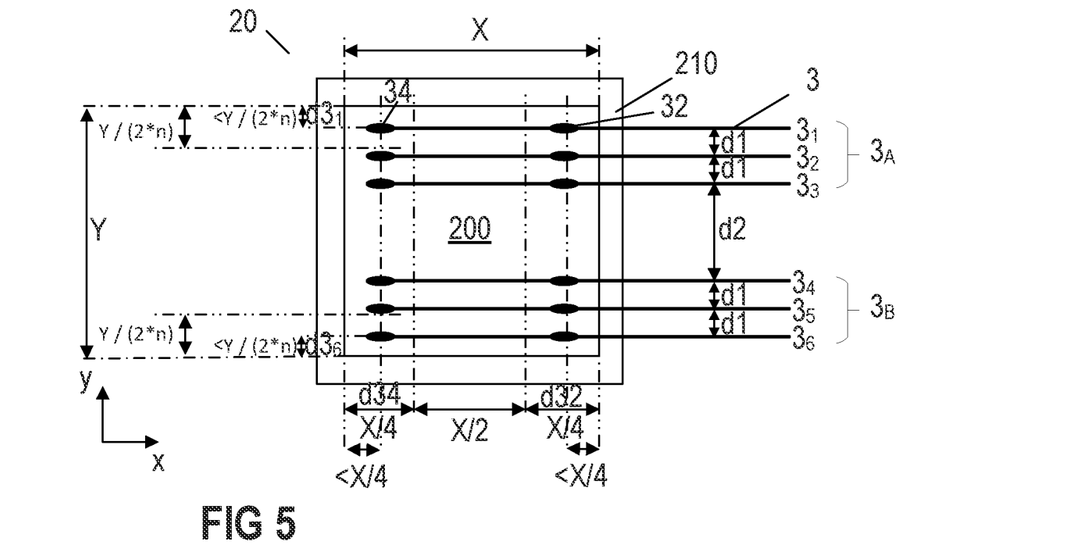
FIG. 5 is a top view of a semiconductor arrangement according to another example.

In the example illustrated in FIG. 4, the distribution of the individual bonding wires $3_n$ in the second horizontal direction y may be the same as in the arrangement as described with respect to FIG. 3 above. However, to further increase the robustness of the bond connections 32, 34 and the lifetime of the semiconductor arrangement, the bonding wires $3_n$ may further be arranged closer to the third and fourth edges as well, as is schematically illustrated in the example of FIG. 5. That is, the outermost bonding wires ($3_1$ and $3_6$ in the example of FIG. 5), may be arranged at distances $d3_1$ and $d3_6$ from the third edge and the fourth edge, respectively, wherein $d3_1<Y/(2*n)$ and $d3_6<Y/(2*n)$, and wherein the fourth edge is arranged opposite to the third edge and the third and the fourth edge are arranged perpendicular to the first and the second edge. That is, for a total number n of seven bonding wires $3_n$, $d3_1<Y/(2*7)=Y/14$ and $d3_6<Y/(2*7)=Y/14$. Generally, any number n of bonding wires $3_n$ is possible, with n>1.

The number n of bonding wires $3_n$ may remain the same as in the example of FIG. 4. However, as is illustrated in the example of FIG. 5, it is also possible that the number n of bonding wires 3 is reduced. The bonding wires 3n may be arranged in a first group $3_A$ and in a second group $3_B$. A distance d1 between two neighboring bonding wires 3 within the same group $3_A$, $3_B$ may be equal. A distance d2 between the first group $3_A$ of bonding wires and the second group $3_B$ of bonding wires may be larger than the distance d1 between two neighboring bonding wires 3 within the same group. In this way, as few bond connections 32, 34 as possible are formed in the center of the active region 200 of the controllable semiconductor element 20. When the overall number of bonding wires 3n is reduced, this results in an increase of the overall resistance. Therefore, a compromise needs to be made to benefit both from an adequately low resistance, and an adequate electric distribution, as well as a sufficient reliability of the connections between the bonding wires $3_n$ and the controllable semiconductor element 20, resulting in an increased lifetime of the semiconductor arrangement.

Figure 6:
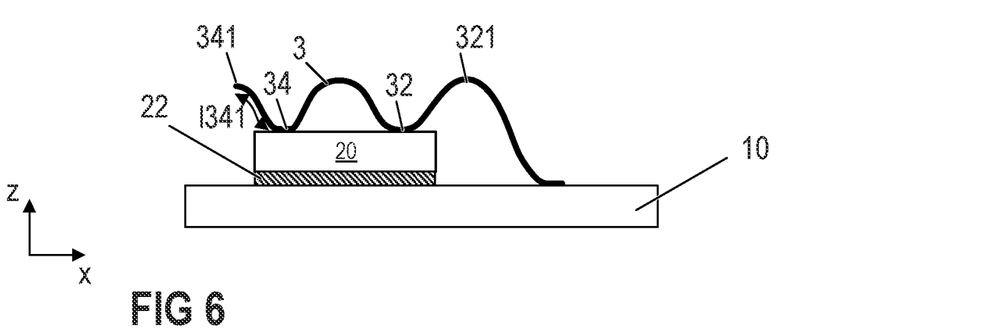
FIG. 6 is a cross-sectional view of a semiconductor arrangement according to one example.

A first end 321 of each bonding wire may be electrically and mechanically coupled to the semiconductor substrate 10 which the controllable semiconductor element 20 is mounted on. The first end 321 may extend from the first bond connection 32 of each bonding wire $3_n$ towards the semiconductor substrate 10. In this way, the top side of the controllable semiconductor element 20 (e.g., a first contact terminal or electrode of the controllable semiconductor element 20) may be coupled to a first potential, for example. The second end 341 of each of the bonding wires 3n may end on the controllable semiconductor element 20. That is, the second bond connection 34 may form the second end of the respective bonding wire $3_n$ (see FIG. 2). According to another example, however, it is also possible that the second end 341 of each bonding wire $3_n$ further extends from the respective second bond connection 34 and is not mechanically or electrically coupled to any other components of the semiconductor arrangement. This is schematically illustrated in FIG. 6. In this example, the second end 341 extends upwards from the second bond connection 34 and ends in midair. The second end 341 may have a length 1341 of at least 1 mm, at least 3 mm, or at least 5 mm, for example. The prolonged second end 341 contributes to the cooling of the bonding wires 3.

Figure 7:
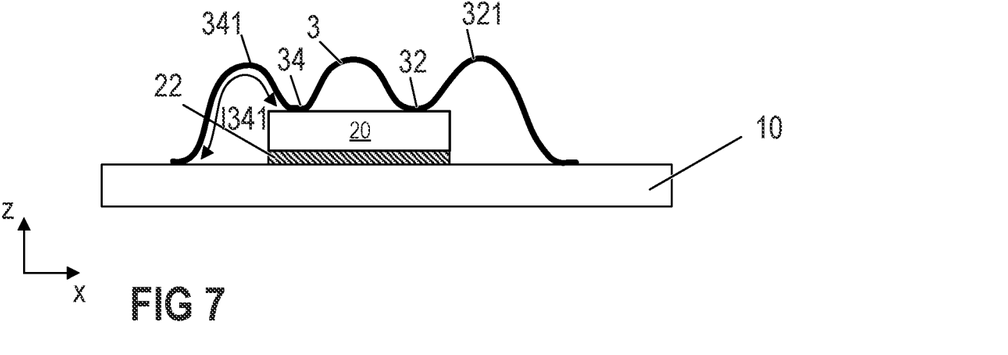
FIG. 7 is a cross-sectional view of a semiconductor arrangement according to another example.

According to another example, as is schematically illustrated in FIG. 7, the second end 341 may also extend further towards the semiconductor substrate 10 and may be mechanically and electrically coupled to the semiconductor substrate 10. That is, the length 1341 of the second end 341 may be extended even further. This may further increase the cooling effect and reduce the temperature of the bonding wire 3. The second end 341 may be mechanically and electrically coupled to a different section of the first metallization layer 111 than the first end 321, for example. In this way, the second end 341 may be coupled to a different electrical potential than the first end 321. According to one example, the second end 341 of the bonding wires $3_n$ is coupled to a section of the first metallization layer 111 which is not coupled to any electrical potential at all. That is, the section of the first metallization layer 111 may not be contacted by any other components or terminals, for example. The additional bond connection between the second ends 341 of the bonding wires $3_n$ and the semiconductor substrate 10, therefore, has the sole function of cooling the bonding wires $3_n$. The second end 342 is not used to electrically contact the controllable semiconductor element 20. An electrical contact is solely provided by the first ends 321 of the bonding wires $3_n$.

The arrangements of the second end 341 as described with respect to FIGS. 6 and 7 may be combined with the arrangements of the first and second bond connections 32, 34 as has been described with respect to FIGS. 4 and 5 above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement, comprising:
a controllable semiconductor element comprising an active region of doped semiconductor material; and
a plurality of bonding wires arranged in parallel to each other in a first horizontal direction,
wherein the active region has a first length in the first horizontal direction and a first width in a second horizontal direction perpendicular to the first horizontal direction,
wherein each of the plurality of bonding wires is electrically and mechanically coupled to a first contact terminal at a top side of the controllable semiconductor element by a first number of bond connections,
wherein each of the bond connections is arranged above the active region in a vertical direction that is perpendicular to the first horizontal direction and the second horizontal direction,
wherein a first bond connection of each of the plurality of bonding wires is arranged at a first distance from a first edge of the active region in the first horizontal direction,
wherein the first distance is less than the first length divided by twice the first number of bond connections,
wherein the first bond connection of each of the plurality of bonding wires is the bond connection arranged closest to the first edge,
wherein a second bond connection of each of the plurality of bonding wires is arranged at a second distance from a second edge of the active region in the first horizontal direction,
wherein the second edge is arranged opposite the first edge,
wherein the second distance is less than the first length divided by twice the first number of bond connections,
wherein the second bond connection of each of the plurality of bonding wires is the bond connection arranged closest to the second edge,
wherein the active region of the controllable semiconductor element is a region configured to carry a current when the controllable semiconductor element is used,
wherein the controllable semiconductor element further comprises an edge region of semiconductor material surrounding the active region in a horizontal plane and that does not carry any currents,
wherein the plurality of bonding wires are electrically and mechanically coupled to the first contact terminal above the active region of the controllable semiconductor element but not the edge region.

2. The semiconductor arrangement of claim 1, wherein:
a first bonding wire of the plurality of bonding wires is arranged closest to a third edge of the active region that is perpendicular to the first and the second edge;
a distance between the first bonding wire and the third edge is less than the first width divided by twice an overall number of the plurality of bonding wires;
a second bonding wire of the plurality of bonding wires is arranged closest to a fourth edge of the active region that is opposite the third edge;
a distance between the second bonding wire and the fourth edge is less than the first width divided by twice the overall number of the plurality of bonding wires.

3. The semiconductor arrangement of claim 1, wherein a distance between two neighboring bonding wires is equal for the plurality of bonding wires.

4. The semiconductor arrangement of claim 1, wherein:
the plurality of bonding wires is arranged in a first group and a second group;
the bonding wires within each of the first and second group are equally spaced from each other; and
a distance between the first group of bonding wires and the second group of bonding wires is greater than a distance between the individual bonding wires of each group.

5. The semiconductor arrangement of claim 1, wherein a first end of each of the plurality of bonding wires extends from the respective first bond connection and is mechanically and electronically coupled to a semiconductor substrate.

6. The semiconductor arrangement of claim 5, wherein a second end of each of the plurality of bonding wires extends from the respective second bond connection and is not mechanically or electrically coupled to any other components.

7. The semiconductor arrangement of claim 5, wherein a second end of each of the plurality of bonding wires extends from the respective second bond connection and is mechanically and electrically coupled to the semiconductor substrate, and wherein the second end of each of the plurality of bonding wires is not used to electrically contact the controllable semiconductor element such that an electrical contact is solely provided by the first ends of the plurality of bonding wires.

8. The semiconductor arrangement of claim 7, wherein:
the semiconductor substrate comprises a dielectric insulation layer and a first metallization layer attached to the dielectric insulation layer;
the first metallization layer is a structured layer comprising at least two different sections, recesses are formed between the at least two different sections;
the controllable semiconductor element is mounted on the first metallization layer;

the first end of each bonding wire is mechanically and electrically coupled to a first section of the first metallization layer; and the second end of each bonding wire is mechanically and electrically coupled to a second section of the first metallization layer different from the first section.

9. The semiconductor arrangement of claim 7, wherein the first end of each of the plurality of bonding wires is electrically coupled to a different electrical potential than the second end of each of the plurality of bonding wires.

10. The semiconductor arrangement of claim 6, wherein a length of the second end of each of the plurality of bonding wires is at least 1 mm, at least 3 mm, or at least 5 mm.

11. A method for producing a semiconductor arrangement, the method comprising:

mounting a plurality of bonding wires on a controllable semiconductor element, the controllable semiconductor element comprising an active region of doped semiconductor material, wherein mounting the plurality of bonding wires on the controllable semiconductor element comprises:

for each of the plurality of bonding wires, forming a first number of bond connections between the bonding wire and a first contact terminal at a top side of the controllable semiconductor element, thereby electrically and mechanically coupling the bonding wire to the first contact terminal at the top side of the controllable semiconductor element, wherein:

the plurality of bonding wires is arranged in parallel to each other in a first horizontal direction;

the active region has a first length in the first horizontal direction and a first width in a second horizontal direction perpendicular to the first horizontal direction;

each of the bond connections is arranged above the active region in a vertical direction that is perpendicular to the first horizontal direction and the second horizontal direction;

a first bond connection of each of the plurality of bonding wires is arranged at a first distance from a first edge of the active region in the first horizontal direction, the first distance is less than the first length divided by twice the first number of bond connections, the first bond connection of each of the plurality of bonding wires is the bond connection arranged closest to the first edge, a second bond connection of each of the plurality of bonding wires is arranged at a second distance from a second edge of the active region in the first horizontal direction, the second edge is arranged opposite the first edge, the second distance is less than the first length divided by twice the first number of bond connections, the second bond connection of each of the plurality of bonding wires is the bond connection arranged closest to the second edge, the active region of the controllable semiconductor element is a region configured to carry a current when the controllable semiconductor element is used, the controllable semiconductor element further comprises an edge region of semiconductor material surrounding the active region in a horizontal plane and that does not carry any currents, the plurality of bonding wires are electrically and mechanically coupled to the first contact terminal above the active region of the controllable semiconductor element but not the edge region.

* * * * *